United States Patent [19]

Komeya et al.

[11] Patent Number: 4,539,298

[45] Date of Patent: Sep. 3, 1985

[54] HIGHLY HEAT-CONDUCTIVE CERAMIC MATERIAL

[75] Inventors: Katsutoshi Komeya, Oiso; Akihiko Tsuge, Yokohama; Hiroshi Inoue, Kawaguchi; Hiroyasu Ohta, Yokohama, all of Japan

[73] Assignee: Tokyo Shibaura Denki Kabushiki Kaisha, Kawasaki, Japan

[21] Appl. No.: 443,955

[22] Filed: Nov. 23, 1982

[30] Foreign Application Priority Data

Nov. 25, 1981 [JP] Japan ................... 56-187761
Oct. 14, 1982 [JP] Japan ................... 57-179096

[51] Int. Cl.$^3$ ............... C04B 35/56; C04B 35/58
[52] U.S. Cl. ................................ 501/89; 501/92; 501/96
[58] Field of Search ................... 501/89, 92, 96

[56] References Cited

U.S. PATENT DOCUMENTS

| | | | |
|---|---|---|---|
| 3,492,153 | 1/1970 | Ervin, Jr. | 501/89 |
| 3,649,310 | 3/1972 | Yates | 501/92 |
| 4,105,455 | 8/1978 | Koga et al. | 264/65 |
| 4,332,755 | 6/1982 | Murata | 501/89 |

FOREIGN PATENT DOCUMENTS 2035767 2/1971 Fed. Rep. of Germany .
2023185 12/1979 United Kingdom .

OTHER PUBLICATIONS

Chemical Abstracts, vol. 91, 1979, p. 298, No. 197775q, Shibaura Electric.
European Search Report, EP 82110909.
Ruh and Zangvil, "Composition and Properties of Hot-Pressed SiC-AlN Solid Solutions," 836 *Journal of the American Ceramic Society*, vol. 65(1982) May.
Chemical Abstracts, vol. 77, 1972, pp. 225-226, No. 168047j.
Chemical Abstracts, vol. 83, 1975, p. 269, No. 151373p, Shibaura Electric.

*Primary Examiner*—Mark L. Bell
*Attorney, Agent, or Firm*—Schwartz, Jeffery, Schwaab, Mack, Blumenthal & Evans

[57] ABSTRACT

Disclosed is a highly heat-conductive ceramic material which is basically of SiC-AlN system, comprising SiC, AlN and one or more of metal oxide selected from CaO, BaO and SrO, each in a prescribed amount. The SiC may otherwise be one whose particle surface is coated with the AlN.

7 Claims, No Drawings

HIGHLY HEAT-CONDUCTIVE CERAMIC MATERIAL

BACKGROUND OF THE INVENTION

The present invention relates to a highly heat-conductive ceramic material. More particularly, it relates to a ceramic material exhibiting excellent heat radiation, having high density and being rich in electrical insulation.

There has recently been great progress in integration of electronic equipment as seen from the development of IC, LSI, etc., and it has been strongly desired to develop insulating material having excellent heat radiation property.

As such an insulating material, various kinds of ceramics have been widely used. For instance, ceramics made of aluminum oxide ($Al_2O_3$) are predominantly for IC substrates. Berylium oxide (BeO) is also used for such materials, and some of the materials have begun to employ silicon carbide (SiC), boron nitride (BN) and aluminum nitride (AlN).

The $Al_2O_3$, however, has its limitation in heat-conductivity (about 30 W/m° K at best) and is not suitable for enhancing its heat radiation property. In the case of BN, ceramics of hexagonal system are poor in strength and those of cubic system are as expensive as a diamond, both of which are accordingly not suitable for common use and not advantageous industrially. As to the AlN, those which are practically used contain inevitable impurities such as oxygen or a trace amount of Si, although they are highly heat-conductive theoretically. As a result, they only show the heat-conductivity about 2 to 3 times better than that of $Al_2O_3$. Further, SiC is also a material having high heat-conductivity. However, its electrical resistance is generally poor and is not suitable for insulating materials.

Recently, there has been development of SiC-BeO system materials which have both the great insulating property and the heat conductivity, as reported in Japanese Laidopen Patent Applications Nos. 66086/1981, 2591/1982 and 15484/1982. These materials, however, cannot be used under a high voltage since they have varistor characteristics, and in addition, are inconvenient for practical use since they require the poisonous substance Be during their production steps.

Thus, it has long been desired to provide materials having further superior heat radiation property and simultaneously having high insulating property, because the conventional highly heat-conductive ceramics have both advantages and disadvantages.

SUMMARY OF THE INVENTION

Accordingly, it is an object of this invention to provide a ceramic material which is excellent in both the heat radiation property and the insulating property so that the above-mentioned industrial demands may be satisfied.

According to this invention, there is provided a highly heat-conductive ceramic material which is basically of SiC-AlN system, and it comprises silicon carbide (SiC), aluminum nitride (AlN) and one or more of metal oxide selected from the group consisting of calcium oxide (CaO), barium oxide (BaO) and strontium oxide (SrO). In an embodiment according to this invention, these components are present in an independently dispersed state to form a sintered body. In another embodiment of the invention, however, the SiC may be coated with the AlN to form a sintered body together with other CaO, BaO and/or SrO. Hereinafter, the former embodiment will be referred to as "the first embodiment of the invention" and the latter embodiment as "the second embodiment of the invention".

DETAILED DESCRIPTION OF PREFERRED EMBODIMENTS

According to the first embodiment of this invention, the highly heat-conductive ceramic material comprises i) more than 0 to 85% by weight of silicon carbide, ii) 0.1 to 5% by weight of one or more of metal oxide selected from the group consisting of calcium oxide, barium oxide and strontium oxide, and iii) the balance of alumium nitride.

The ceramic material of the above first embodiment may further contain 0 to 5 wt. % of carbon (C) based on the total amount.

The ceramic material may be prepared by mixing more than 0 to 85% by weight of silicon carbide powder, 0.1 to 5% by weight of one or more of powders selected from the group consisting of calcium oxide, barium oxide, strontium oxide and a compound to be converted into said oxide by thermal decomposition (i.e. a precursor of said oxide), and the balance of aluminum nitride powder; forming the powdery mixture thus obtained into a desired shape, which is then sintered within the temperature range of from 1600° to 1820° C.

The powdery mixture must contain SiC as a mixed component in an amount of not more than 85% (exclusive of 0%) by weight relative to the total amount of the powdery mixture, preferably in an amount of not more than 65% by weight. If the mixing proportion of SiC exceeds 85% by weight, the insulating property of the resultant ceramics obtained by sintering will become inferior, whereby intended object of the invention will not be achieved. Grain size of the powdery SiC to be used should generally be about 0.5 to 2 μm.

Added to the powdery mixture is one or more of powdery oxide selected from CaO powder, BaO powder and SrO powder, or powder of a precursor of said oxide which is exemplified by $CaCO_3$ and $CaNO_3$ in respect of CaO; $BaCO_3$, and $BaNO_3$ in respect of BaO; and $SrCO_3$ and $SrNO_3$ in respect of SrO, which are sintering aids. The mixing proportion thereof should be 0.1 to 5% by weight relative to the total amount of the powdery mixture, preferably be 0.5 to 3% by weight. If it is less than 0.1% by weight, there will be no effect as a sintering aid. If it exceeds 5% by weight, the addition of sintering aid will not only become useless because the effect as a sintering aid is saturated, but also it is inconvenient because the heat conductivity of the ceramics to be obtained by sintering is lowered.

The balance of the powdery mixture is constituted by the AlN. The grain size of powdery AlN to be used may be generally 0.2 to 2 μm.

The powdery mixture is prepared by blending the mixed powder of the above-described composition for a predetermined time in a grinding and mixing machine such as a ball mill. The powdery mixture thus prepared is then packed in a desired mold, pressed by a conventional method and formed into a molded body. The molding operation may be effected smoothly by adding in advance to the powdery mixture about 5 to 10% by weight of an organic binder such as paraffin or stearic acid. (The amount of the binder may vary depending on the kind of binder and the manner of molding).

The molded body is then sintered to make the ceramics according to this invention. The binder component may be removed by subjecting, before sintering, the molded body to provisional sintering at a temperature of about 450° C. and in a nitrogen stream, for example.

Sintering may be effected in any atmosphere if it is a non-oxidative atmosphere where no reaction with SiC and AlN takes place. Usually, it may be an argon gas atmosphere. As a method of sintering, there may be generally applicable a hot press method by which the molded body is placed into a carbon mold and then pressed under heating. Also applicable is a hot isostatic press (HIP) method, which is suitable for producing a homogeneous product having a complicated shape. These methods may be performed under pressure of 100 to 3000 kg/cm$^2$ in general, or may be performed under ambient pressure when sintering a molded body, containing AlN in a large proportion.

It is a prerequisite in this invention that the sintering temperature in the above sintering process is controlled within a temperature range of from 1600° to 1820° C. If the temperature is lower than 1600° C., it is difficult to obtain a densified ceramic material and there occurs difficulties in its properties of heat-conduction, etc. If it exceeds 1820° C., the heat-conductivity of the resultant ceramics is lowered abruptly.

In the second embodiment of this invention, the highly heat-conductive ceramic material comprises i) 0.01 to 3% by weight of one or more of metal oxide selected from the group consisting of calcium oxide, barium oxide and strontium oxide, and ii) the balance of silicon carbide whose particle surface is coated with aluminum nitride.

According to this embodiment, every particle of the silicon carbide is coated with aluminum nitride to form a composite by itself, which is linked to other composites by a sintering aid such as calcium oxide, barium oxide, strontium oxide, or a precursor of such a metal oxide. In the above ceramic material, densification of the resultant material will become difficult because of lack of a effect by the sintering aid, if the amount of the metal oxide is less than 0.01% by weight. On the other hand, if it exceeds 3% by weight, the product will undergo excessive sintering because of an excess of the sintering aid and an excess of the liquid phase upon sintering, and such excess of the sintering aid will make the resultant ceramics disadvantageous with respect to its heat-conduction.

The ceramic material according to this second embodiment may further contain carbon in the amount of not more than 10% by weight based on the amount of aluminum nitride. The object of using carbon is to exclude oxygen present in the ceramic material, thus rendering aluminum nitride susceptible to oxidation.

Further, the ceramic material according to this embodiment may contain a further aluminum nitride in an amount of not more than 100% by weight based on the amount of metal oxide. As the aluminum nitride exhibits an effect to make the ceramic material denser, materials having a high sintered density may be obtained by its addition.

A process for preparing composite type ceramic materials according to this embodiment of the invention will be described hereunder.

The process is characterized in that a powdery mixture comprising 0.01 to 3% by weight, calculated as the metal oxide, of one or more of powders selected from the group consisting of calcium oxide, strontium oxide, barium oxide and a precursor of said metal oxide, and the balance of silicon carbide whose surface is coated with aluminum nitride, is formed into a desired shape, which is then sintered in a non-oxidative atmosphere.

The composite powder of silicon carbide coated with aluminum nitride preferably comprises aluminum nitride in an amount of 3 to 120% by weight based on silicon carbide. The thickness of aluminum nitride layer to be formed on the surface of silicon carbide may optionally and preferably be chosen, depending on the magnitude of compressive strength of the formed material. The particle size of the composition powder should preferably be 0.2 to 5 $\mu$, more preferably 0.5 to 2 $\mu$ in order to obtain dense ceramic materials.

The crystal system of silicon carbide to be employed may be either $\alpha$-type or $\beta$-type. Such a composite powder may be prepared, for example, by the gas phase reaction method.

The metal oxide powder to be employed in the process of the invention functions as a sintering aid. The precursor of the metal oxide means any substance convertible to calcium oxide, strontium oxide or barium oxide upon sintering and may be exemplified by carbonates, nitrates, acetates or the like of calcium, strontium and barium.

The particle size of such a substance should preferably be small, and, for example, should be 0.2 to 1 $\mu$, more preferably 0.05 to 0.5 $\mu$.

In the process of the invention, the powdery mixture described above may further contain carbon powder or a powdery precursor thereof in the amount of not more than 10% by weight, calculated as carbon, based on aluminum nitride.

The powdery precursor of carbon means any substance convertible to carbon upon sintering and may be exemplified by various resinous substances. The powdery mixture may contain a further aluminum nitirde powder in the amount of not more than 100% by weight based on the metal oxide. The powdery mixture having the composition described above may be prepared according to any conventional blending method, and then formed into a desired shape. Upon forming, there may be employed a binder such as paraffin to improve processability, then forming is performed smoothly. Where a binder is employed, sintering is performed after dewaxing.

Any forming method such as tape forming, injection forming or mold pressing may be used. The powdery mixture described above may be formed by any of forming methods to give a molded body. The molded body is then sintered in a non-oxidative atmosphere such as nitrogen gas, argon gas or $N_2+H_2$ gas. Sintering is preferably performed at a temperature of 1700° to 1900° C.

Upon sintering, the metal oxide forms a low melting point substance with aluminum nitride in the phase reaction within the temperature range mentioned above. As a result, viscosity of the shaped material may be lowered and a ceramic material having such properties as high density, high insulation and good thermal conductivity may be prepared by liquid phase sintering.

Any other sintering method, including HIP (hot isostatic press) and hot pressing, many optionally and preferably be employed, taking into account of an economic factor or the like.

The present invention will be explained in more detail by the following working examples.

EXAMPLE 1

Weighed were 60 g of α-SiC powder having a mean grain size of 0.9 μm, 38 g of AlN powder having a mean grain size of 1.2 μm and 2 g of CaCO₃ powder having a high purity comparable to a reagent. These powdery components were well blended in a ball mill pot to obtain a powdery mixture, in which further dispersed was 7 g (about 7% by weight) of paraffin. The powdery mixture thus obtained was packed in a mold of 37×37×100 mm size, pressed under pressure of 500 kg/cm² and formed into a molded body, which was further subjected to a provisional sintering at 450° C. in a nitrogen stream. The molded body thus treated was then sintered by hot pressing for 30 minutes, which was performed at a temperature of 1800° C., under pressure of 300 kg/cm² and in a nitrogen stream.

Electric resistance of the resultant sintered body was found to be greater than $10^{13}$ Ω.cm under the condition of 10 V/mm, and its heat conductivity was 100 W/m° K.

EXAMPLES 2 TO 12 AND COMPARATIVE EXAMPLES 1 to 4

Following the procedures of Example 1, prepared were 15 kinds of sintered bodies with varied compositions and mixing proportions and under varied conditions as shown in the following Table 1. Density, heat conductivity and electric resistance of each of these products were measured. Results are shown together in Table 1.

EXAMPLE 13

A mixture was made from 98% by weight of powder of silicon carbide coated with aluminum nitride to have a particle size of 1.2 μ (silicon carbide:aluminum nitride×1:0.4 in weight ratio) and 2% by weight of calcium carbonate powder. 100 g of the mixture was blended for 24 hours in a ball mill. At the end of the period, 8 g of paraffin was added to the blended powder as a binder and the resulting mixture was formed into a shape, applying pressure of 500 kg/cm², to give a molded body of 37×37×10 mm. The molded body was dewaxed by heating it up to 700° C. then sintered at 1800° C. for 2 hours in nitrogen atmosphere. The ceramic material thus obtained was found to have electrical resistance of $10^{11}$ Ω.cm as the result of its measurement. Heat conductivity that is indicative of heat radiation property of the material was confirmed to be 0.32 cal/cm.° C. sec.

EXAMPLES 14 TO 18

Following the procedures of Example 13, prepared were 4 kinds of ceramic materials with varied compositions and conditions as shown in Table 2. Sintered density, heat conductivity and electric resistance of each of the resultant products were measured. Results are shown together in Table 2.

The product of Example 2 was further treated for 2 hours by HIP treatment at 1750° C. and 2000 atm. It was confirmed that its sintered density elevated up to 3.26 g/cc.

TABLE 1

| | Composition (wt. %) | | | | Sintering conditions | | | | Density (g/cm³) | Heat conductivity (W/m °K.) | Electric resistance (Ω · cm; 10 V/mm) |
|---|---|---|---|---|---|---|---|---|---|---|---|
| | SiC | AlN | Sintering aid | Other additive | Temp. (°C.) | Pressure (kg/cm²) | Time (min) | Atmosphere | | | |
| Example 2 | 70 | 28 | CaCO₃:2 | — | 1800 | 300 | 60 | Ar | 3.18 | 105 | $10^{10}$ |
| Example 3 | 70 | 27 | CaCO₃:3 | — | " | " | " | " | 3.21 | 101 | " |
| Example 4 | 50 | 49 | CaCO₃:1 | — | " | " | " | " | 3.24 | 90 | $>10^{13}$ |
| Example 5 | " | 47 | " | C:2 | 1750 | " | " | " | 3.23 | 95 | " |
| Example 6 | 40 | 59 | " | — | " | " | " | " | 3.22 | 85 | " |
| Example 7 | " | " | " | — | 1730 | " | " | " | 3.27 | 82 | " |
| Example 8 | 30 | 69 | " | — | 1700 | " | " | " | 3.25 | 78 | " |
| Example 9 | 20 | 79 | " | — | 1800 | — | " | " | 3.21 | 75 | " |
| Example 10 | 50 | 48 | BaCO₃:2 | — | " | 300 | " | " | 3.25 | 80 | " |
| Example 11 | " | 49 | BaO:1 | — | " | " | " | " | 3.24 | 82 | " |
| Example 12 | " | " | SrCO₃:1 | — | " | " | " | " | 3.21 | 73 | " |
| Comparative Example 1 | 90 | 7 | CaCO₃:3 | — | " | " | " | " | 2.82 | 56 | $10^{6}$ |
| Comparative Example 2 | 70 | 30 | — | — | " | " | " | " | 2.85 | 60 | $10^{11}$ |
| Comparative Example 3 | — | 99 | CaCO₃:1 | — | " | " | " | " | 3.25 | 55 | $>10^{13}$ |
| Comparative Example 4 | 70 | 27 | CaCO₃:3 | — | 1950 | " | " | " | " | 25 | " |

TABLE 2

| | Composition (wt. %) | | | | | Sintering conditions | | Density (g/cc) | Heat conductivity (cal/cm. °C. sec) | Electric resistance (Ω · cm; 10 V/mm) |
|---|---|---|---|---|---|---|---|---|---|---|
| Example No. | SiC/AlN (weight ratio) | CaCO₃ | BaCO₃ | AlN | C | Temperature (°C.) | Time (hr) | | | |
| 2 | 98.5 (1/0.5) | 1.5 | — | — | — | 1800 | 2 | 3.20 | 0.33 | $>10^{10}$ |
| 3 | 98 (1/0.5) | — | 2 | — | — | 1800 | 2 | 3.23 | 0.25 | $>10^{10}$ |
| 4 | 98 (1/1) | 1 | — | 1 | — | 1770 | 2 | 3.25 | 0.23 | $>10^{10}$ |

TABLE 2-continued

| Example No. | Composition (wt. %) | | | | | Sintering conditions | | Density (g/cc) | Heat conductivity (cal/cm. °C. sec) | Electric resistance (Ω · cm; 10 V/mm) |
|---|---|---|---|---|---|---|---|---|---|---|
| | SiC/AlN (weight ratio) | CaCO$_3$ | BaCO$_3$ | AlN | C | Temperature (°C.) | Time (hr) | | | |
| 5 | 98.5 (1/1) | 1 | — | 0.5 | — | 1800 | 2 | 3.24 | 0.20 | >10$^{10}$ |
| 6 | 97.5 (1/0.5) | 1.5 | — | — | 1 | 1800 | 2 | 3.20 | 0.35 | >10$^{10}$ |

We claim:

1. A highly heat-conductive ceramic material which consists essentially of (i) an amount of silicon carbide not less than about 20% by weight and up to about 85% by weight, (ii) from about 0.1 to about 5% by weight of at least one metal oxide selected from the group consisting of calcium oxide, barium oxide and strontium oxide, (iii) 0 to about 5% by weight of carbon, and (iv) the balance of aluminum nitride.

2. The ceramic material according to claim 1, wherein the amount of said metal oxide ranges from 0.5 to 3% by weight.

3. The ceramic material according to claim 1, which is prepared by a process comprising mixing (i) not less than about 20 to 85% by weight of silicon carbide powder; (ii) 0.1 to 5% by weight of one or more of powder of metal oxide selected from the group consisting of calcium oxide, barium oxide and strontium oxide or powder of a precursor of said oxide, selected from the group consisting of calcium carbonate, calcium nitrate, barium carbonate, barium nitrate, strontium carbonate and strontium nitrate and (iii) the balance of aluminum nitride powder; forming the powdery mixture into a desired shape, which is then sintered within the temperature range of from 1600° to 1820° C.

4. The ceramic material according to claim 3, wherein the amount of said metal oxide powder or said precursor thereof ranges from 0.5 to 3% by weight.

5. The ceramic material according to claim 3, wherein the sintering is performed by a hot press method.

6. The ceramic material according to claim 3, wherein the sintering is performed by a hot isostatic press (HIP) method.

7. The ceramic material according to claim 3, wherein the sintering is performed under an ambient pressure.

* * * * *